(12) United States Patent
Jezdic et al.

(10) Patent No.: US 6,356,152 B1
(45) Date of Patent: Mar. 12, 2002

(54) AMPLIFIER WITH FOLDED SUPER-FOLLOWERS

(75) Inventors: Andrija Jezdic, Arlington; John L. Wallberg, Richardson; Bryan E. Bloodworth, Irving, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/617,069

(22) Filed: Jul. 16, 2000

Related U.S. Application Data

(60) Provisional application No. 60/143,798, filed on Jul. 14, 1999.

(51) Int. Cl.[7] .................................................. H03F 3/45
(52) U.S. Cl. ........................................ 330/253; 330/258
(58) Field of Search ................................ 330/253, 258, 330/259

(56) References Cited

U.S. PATENT DOCUMENTS

| | | | |
|---|---|---|---|
| 5,142,242 A | | 8/1992 | Schaffer ..................... 330/253 |
| 5,451,901 A | | 9/1995 | Welland ..................... 330/133 |
| 5,512,858 A | * | 4/1996 | Perrot ........................ 330/258 |
| 5,578,964 A | * | 11/1996 | Kim et al. .................. 330/258 |
| 5,598,117 A | * | 1/1997 | Deguchi ..................... 330/253 |
| 5,854,574 A | * | 12/1998 | Singer et al. ............... 330/253 |
| 6,118,340 A | * | 9/2000 | Koen ......................... 330/253 |

* cited by examiner

*Primary Examiner*—Robert Pascal
*Assistant Examiner*—Khanh Van Nguyen
(74) *Attorney, Agent, or Firm*—Pedro P. Hernandez; W. James Brady, III; Frederick J. Telecky, Jr.

(57) ABSTRACT

Fixed gain amplifiers have particular use in the read channel of hard disk drives. A CMOS fixed gain amplifier 18c having a constant gain over the large dynamic range of hard disk drive applications is provided by incorporating super follower transistors M3 and M4 into the input stage of the fixed gain amplifier. The super follower transistors are folded into the output stage of the amplifier. The differential current through the degeneration resistor RE1 travels through the super follower transistors M3 and M4 and into the current mirrors I5 and I6. Thus the ac differential current goes directly to the cascoded stage, into the load resistors RL1 and RL2, and to the output load.

6 Claims, 3 Drawing Sheets

US 6,356,152 B1

AMPLIFIER WITH FOLDED SUPER-FOLLOWERS

This application claims priority under 35 USC §119(e)(1) of provisional application number 60/143,798 filed Jul. 14, 1999.

FIELD OF INVENTION

This invention relates generally to electronic amplifiers and more particularly to CMOS fixed gain amplifiers.

BACKGROUND OF THE INVENTION

Amplifiers are commonly used in electronic applications. One example of the use of an amplifier is in a disk storage system commonly used in personal computers known as hard disk drives, HDD. U.S. Pat. No. 5,831,888 entitled "Automatic Gain Control Circuit" and assigned to Texas Instruments Incorporated, the assignee of the present invention, sets forth generally the description of disk storage. The HDD device generally includes a magnetic storage media, such as rotating disks or platters, a spindle motor, read/write heads, an actuator, a preamplifier, a read channel, a write channel, a servocontroller, a memory and control circuitry to control the operation of the HDD and to properly interface the HDD to a host or system bus. The following U.S. Patents describe various aspects of HDD devices:

| | | |
|---|---|---|
| 5,535,067 | Frequency Controlled Reference Generator Issued | 07/09/96 |
| 5,570,241 | Single Channel, Multiple Head Servo . . . | 10/29/96 |
| 5,862,005 | Synchronous Detection Of Wide BI-Phase . . . | 01/19/99 |
| 5,793,559 | In Drive Correction Of Servo Pattern . . . | 08/11/98 |
| 5,719,719 | Magnetic Disk Drive With Sensing . . . | 02/17/98 |
| 5,444,583 | Disk Drive Having On-Board Triggered . . . | 08/22/95 |
| 5,448,433 | Disk Drive Information Storage Device . . . | 09/05/95 |
| 5,208,556 | Phase Lock Loop For Sector Servo System | 05/04/93 |
| 5,642,244 | Method and Apparatus For Switching . . . | 06/24/97 |

Prior art FIG. 1 illustrates a partial HDD system. A disk/head assembly 12 stores data. A magnetoresistive, MR, head 14 works through magnetic media to read data from disk 12 or to write data to disk 12. A write occurs through an inductive element in the MR head to the magnetic media disk assembly 12 and a read occurs by sensing the magnetic shifts in the disk assembly 12 by using the resistive read element of the MR head 14. A preamplifier 16, typically of the single ended variety, connects to MR head 14 to provide an initial amplification stage. The output of the preamplifier 16 is an analog signal which flows to a read channel 18 for further processing.

The read channel 18 in prior art FIG. 1 takes the analog signal from preamplifier 16 and conditions it to provide a digital output signal that will be sent by an appropriate bus structure to other components of a computer system, such as, for example, the digital signal processor in either the modem or the graphics card. An automatic gain control circuit 18a is the first part of the read channel 18. It provides an output signal having a larger amplitude than the input from preamplifier 16. A low pass filter 18b receives the amplified read signal and removes undesirable noise, such as high frequency noise, and generates a filtered read signal that is input to a fixed gain amplifier 18c. The output signal of the low pass filter 18b is typically a fairly large voltage input of around a 0.4 volt peak to peak differential. From there, the signal flows into a fixed gain amplifier, FGA, 18c. The fixed gain amplifier 18c provides sufficient amplification to the output of the low pass filter 18b to allow sample space processor 18d and digital processor 18e to perform the analog to digital conversion of the read signal.

There are several requirements that govern the design of fixed gain amplifier 18c. Power supply voltages are continually decreasing and are typically below 2.9 volts, at present, in CMOS applications. Given the low power supply, a CMOS amplifier still needs to have a really wide linear range and be fast enough to support the data rate at which the channel operates. The frequency range of the HDD is up to around 300 megahertz, at present. The output signal of low pass filter 18b, being about 0.4 volt peak to peak differential, is a very high input to the FGA 18c. If FGA 18c were just a regular differential pair, it would have a linear range of only about 26 millivolts which is very tiny. Additionally, one thing the FGA 18c should not do is to ruin what was done in the AGC 18a and the LPF 18b. So the total harmonic distortion, THD, should be very low, yet both the gain and a high bandwidth must be preserved. Additionally, the FGA 18c should provide a reasonable amount of amplification (typically around 4 V/V) and be manufacturable. That is, when built on silicon, it must be easy to match and be flexible.

Prior art FIG. 2 illustrates a fixed gain amplifier typical of the type used for FGA 18c. FGA 18c has two main parts: an amplifier core 20; and a common mode feedback circuit 22. In the amplifier core 20, the resistor RE1 is typically referred to as emitter degeneration resistor. Input transistors M1 and M2 are CMOS source followers. They follow the input voltage appearing at inputs Vin and VinB. Resistors RL1 and RL2 are the load resistors. Transistors M5 and M6 are cascoded devices. Transistor M5 and current source I5 form a cascoded mirror that is a high swing cascoded mirror. [In integrated circuit structures, when one device is connected on top of another device, (current source I5 is actually a MOS transistor in a silicon implementation) the structure is referred to as a cascoded stage.] Output transistors M5 and M6 are cascoded transistors that actually shield the mirroring transistors I5 and I6 (shown as ideal sources) so that the voltages on node 5 and node 6 don't vary too much.

The common mode feedback circuit 22 of prior art FIG. 2, as the name implies, provides a mechanism to control the common mode voltage. It helps keep the dc values of the output nodes Vout and VoutB at a desired value independent of the variations in the manufacturing process and the fluctuations in the operating conditions. The common mode needs to be controllable because the next stage, the sample space processor 18d, can operate correctly only for a very narrow range of input common mode voltages. A very simple amplifier compares the reference common mode to the actual extracted common mode at the output. The circuit thus compares the common mode voltage to the average voltage at Vout and VoutB to see what the dc value of the output is. If the value is larger than the common mode, it needs to be brought down. If the value is smaller than the common mode, it needs to be brought up. The circuit folds transistors M9 and M10 into amplifier 20 and injects current on nodes N5 and N6 in order to affect the total DC current going through the load resistors RL1 and RL2 and consequently set the correct output common mode.

In prior art FIG. 2, the degeneration resistor RE1 on the input stage of the amplifier allows for a larger input voltage with a larger input voltage swing. By adding the degeneration resistor, the linear range of the amplifier is improved. The differential current that goes through the input source followers M1 and M2 is defined by the size of the resistor RE1 and the swing of the differential input voltage. With appropriate sizing of resistor RE1 the differential current going through M1 and M2 can be made reasonably smaller than the DC current going through M1 and M2, hence improving the linear range and reducing the overall distortion of the output signal. However, what brings in the majority of distortion to the amplifier is that the total currents through M1 and M2 are not independent of the input signal. In other words, the voltage gain across M1 and M2 instead of being constant is directly modulated by the variation in the input signal causing distortions in the output signal. The prior art circuit thus has gain dependant on the amplitude of the differential input signal making it unsuitable for very low distortion applications.

U.S. Pat. No. 5,142,242 to Schaffer, issued Aug. 25, 1992, provides a method of making the gain of the input transistors less dependant on the variation in the input signal. In the CMOS embodiment disclosed in FIG. 9, it provides a way to reduce the variation in the gain of the input transistors by mirroring the current at transistors Q8 to transistors Q10 and Q11. A problem with this approach, however is the mirror in the amplifier's signal path creates a low frequency pole making the amplifier too slow for HDD applications where the usable frequencies extend into the 300 megahertz range. Another problem with this approach is that it is based on an inaccurate approximation that NMOS and PMOS transistors (Q6 and Q7 consequently) have identical behavior, needed for a complete cancellation of the distortion inherent to the recommended circuit topology. U.S. Pat. No. 5,451,901 to Welland, issued Sep. 19, 1995 uses a similar concept as the above '242 patent to reduce the gain dependency on the variation in the input signal. MOS transistors M9 and M11 form a mirror that is similar to '242 patent. It is a different way of forming a mirror, but it is still a current mirror. While this circuit is faster than the '242 circuit, it is too slow for typical HDD applications. Node 78 and node 80 charge faster because of transistors M11 and M12 respectively, but they still form mirrors that are too slow. Moreover, the gain of input transistors M7 and M8 is not independent from the variation in the input signal, making the distortion level too high for common HDD applications.

What is needed, therefore, is a CMOS amplifier whose gain is very constant over a large dynamic range and is fast enough for HDD applications. It is accordingly an object of the invention herein to provide such an amplifier.

Other objects and advantages of the invention herein will be apparent to those of ordinary skill in the art having the benefit of the description herein.

SUMMARY OF THE INVENTION

A CMOS fixed gain amplifier incorporates super follower transistors into its input stage and folds the super follower transistors into its output stage to provide a constant gain over a large dynamic range for particular usefulness in hard disk drive applications.

DETAILED DESCRIPTION OF THE PREFERRED EMBODIMENT

The invention herein provides a fixed gain amplifier suitable for HDD read channel applications. It handles the large voltage input and still maintains a gain that is very constant and independent of the amplified input signal. It has very small THD of about 0.35 percent and high bandwidth of around 300 megahertz. The application is very predictable, is very easy to design and is very flexible. It offers a solution to the problem of building highly linear wide bandwidth CMOS amplifiers operating at power supplies below 2.9 volts while maintaining a large dynamic range. Because of its folded architecture, described below, power supply rejection (PSR) and the amplifier's bandwidth are enhanced, while providing a flexible platform to optimize both noise and total harmonic distortion without sacrificing device matching.

Figure 1:
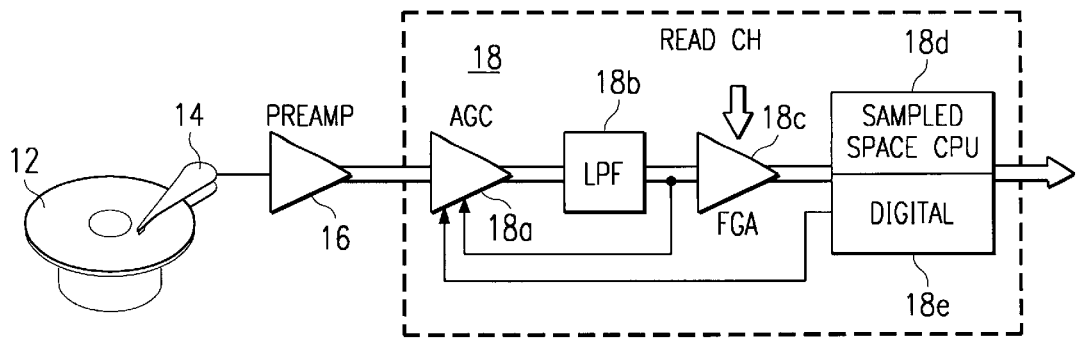
FIG. 1 is a prior art drawing illustrating a partial read channel used in a hard disk drive storage application.
Figure 2:
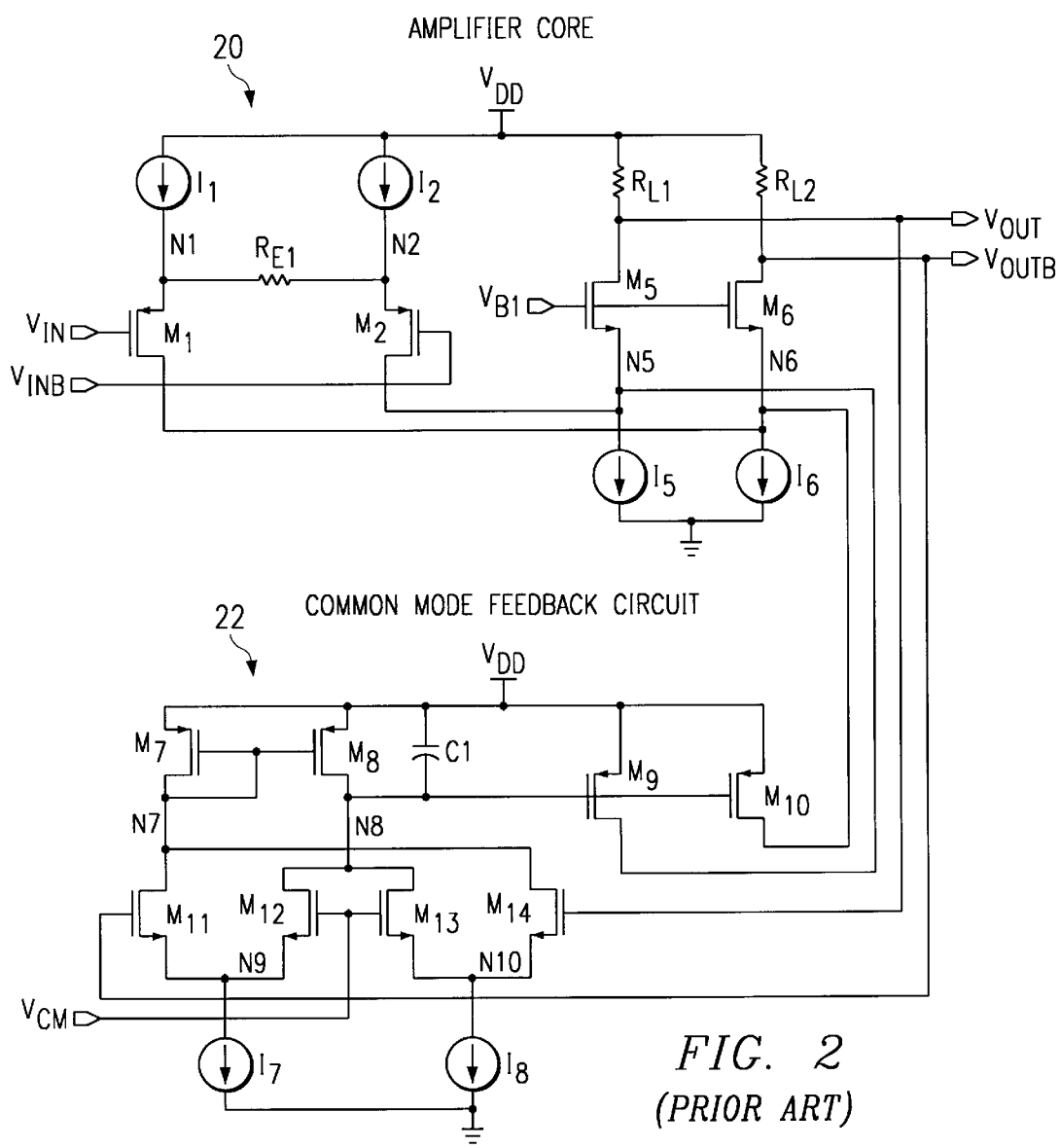
FIG. 2 is a prior art drawing illustrating the fixed gain amplifier 18c of prior art FIG. 1.
Figure 3:
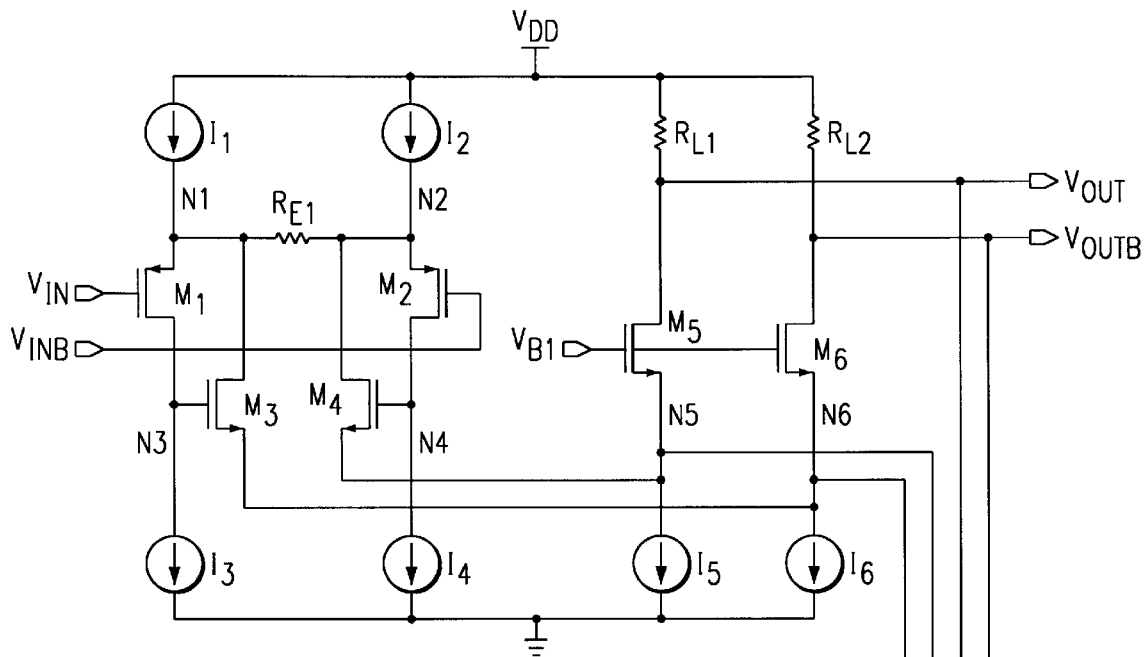
FIG. 3 is a drawing illustrating a fixed gain amplifier according to the preferred embodiment of the invention.
Figure 3:
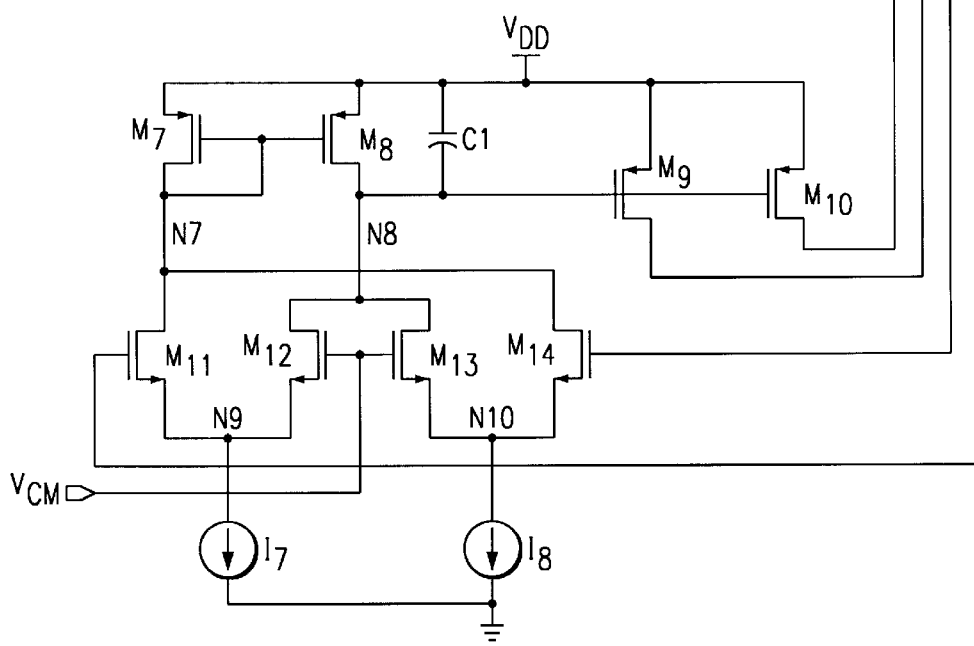

FIG. 3 depicts an electrical schematic of the preferred embodiment of the inventive fixed gain amplifier. By comparing FIG. 3 to prior art FIG. 2, aspects of the inventive fixed gain amplifier having folded super-follower transistors M3 and M4 can be readily seen as common reference numerals are used in the figures.

In FIG. 3, transistors M3 and M4 are added to amplifier core 20 as well as ideal current sources I3 and I4. MOS transistor M3 has its source and drain connections connected across degeneration resistor RE1 and node N6 (between transistor M6 and current source I6) and its gate connected to node N3 (between transistor M1 and current source I3). MOS transistor M4 has its source drain connections connected across degeneration resistor RE1 and node N5 (between transistor M5 and current source I5) and has its gate connected to node N4 (between transistor M2 and current source I4). Transistors M3 and M4 are referred to as super-follower transistors because they are conducting (i.e. following) the entire differential current passing through resistor RE1. The prefix "super" is added to differentiate this configuration from a common-drain configuration typically called a "source-follower." They are additionally folded into the next stage current mirror of I5 and I6.

The circuit of FIG. 3 operates generally as the amplifier of prior art FIG. 2 but with advantages of bandwidth, linearity, large dynamic range, power supply rejection and noise rejection. The input to the circuit is a differential voltage applied at pins Vin and VinB, while the output of the circuit is a differential voltage at pins Vout and VoutB. A single-ended voltage applied to pin Vcm defines the output common mode voltage. Pin VB1 should be set to an appropriate constant bias voltage to keep the cascoded transistors M5 and M6 saturated over all operating conditions. When the input differential signal across Vin and VinB is zero, the voltage across resistor RE1 is zero and therefore there is no current flowing through it. For the same condition, currents through M1 and M2 are identical, as well as currents through M3 and M4. As the magnitude of the input signal Vin and VinB becomes larger than zero the voltage across resistor RE1 is also larger than zero generating a differential current through resistor RE1. Since currents through transistors M1 and M2 are set by current sources I3 and I4 respectively, the differential current formed through resistor RE1 must go through the super-followers M3 and M4 without affecting the currents through M1 and M2. Since the currents through transistors M1 and M2 are constant and independent from the input signal Vin, VinB there will be no distortion contribution from these two transistors to the output signal Vout, VoutB making a significant contribution to the linearity of the entire amplifier.

When all the transistors are biased up, the current I1 is larger than I3 in order to provide some quiescent current for super-follower M3. In the same fashion, the current I2 is larger than current I4 to provide some quiescent current for super-follower M4. So, there is always some quiescent current going through transistors M3 and M4 that comes from I1 and I2. When the magnitude of the input signal Vin, VinB is larger than zero the differential current formed through resistor RE1 will flow through super-followers M3 and M4 but in opposite directions. Therefore, to minimize the distortion in the output signal due to the variable current going through the super-followers M3 and M4 the differential current through these two transistors must be much smaller than the quiescent current through the same transistors. In mathematical terms this condition can be expressed by the following formula:

$$I1 - I3 \gg \frac{\max|Vin - VinB|}{RE1} \text{ and } I2 - I4 \gg \frac{\max|Vin - VinB|}{RE1}$$

Note that the distortion contribution of the super-followers was further reduced by connecting their gates to nodes N3 and N4 respectively. A small voltage variation on nodes N3 and N4 will have negligible effects on the currents going through the input transistors M1 and M2 making them the perfect spots to connect the gates of M3 and M4. Therefore, by proper biasing of the super-followers M3 and M4 they will have a negligible contribution to the overall distortion of the amplified output signal.

In FIG. 3, the ac current from transistors M3 and M4 is folded into the next stage mirror of I5 and I6. This significantly speeds up the amplifier as opposed to the prior art mirroring approaches described in the Background of The Invention. The differential current through the transconductor is very fast. The differential current searches for the low impedance node to flow through, node N5 for example. The circuit's bandwidth is improved because the signal path consists of low impedance nodes only (N1, N2 and N5 and N6). The current in current sources I5 and I6 is constant. On top of this, the ac current from super-followers M3 and M4 is added, or folded. Thus, the ac current goes directly to the cascoded stage and into load resistors RL1 and RL2, and, goes to the output load.

In the preferred embodiment of FIG. 3, the cascoded stage resistors RL1 and RL2 form the amplifiers gain. A constant gain is achieved because the ratio of load resistor RL1 and degeneration resistors RE1 forms the gain, and, the gain is constant because the resistors can be matched. In the prior art U.S. Pat. No. 5,451,901 to Welland, MOS device M13, M20 and M21 are used as resistors. A problem with using MOS devices as resistors is that MOS devices are smaller than resistors and it is difficult to match their conductances and linear regions. Resistors can be well controlled and are more accurate. Thus, distortion from a nonlinear MOS device is avoided. By varying the ratio of the current sources I5 vs I1 (or I3 in a sense) or by varying how much differential current goes to folded super follower transistors M3 and M4 versus their dc current, the THD can be directly affected. The smaller the ac differential current is to the dc current, the less variation (percentage wise) exist, the Gm varies less and therefore better performance is achieved. The current through input transistors M1 and M2 in the ideal case is constant and nonvarying. The only loss (from THD) could be from folded super-follower transistors M3 and M4. However, they don't really affect it that much because their only task is to get the differential current to the next stage. So, the Gm of folded super-followers M3 and M4 is not really that important in actually setting the gain for amplifier 18 as the signal goes through the low impedance nodes.

In the preferred embodiment of FIG. 3, the linearity of the transfer characteristic is very high as a consequence of the folded architecture and the constant current running through the input transistors M1 and M2. By folding transistors M3 and M4 into current mirrors I5 and I6, the linearity can be easily controlled by the amount of current set by current sources I1–I6 and by controlling the differential current going through transistors M3 and M4 set by the input voltage swing and the size of degeneration resistor RE1.

Figure 4:
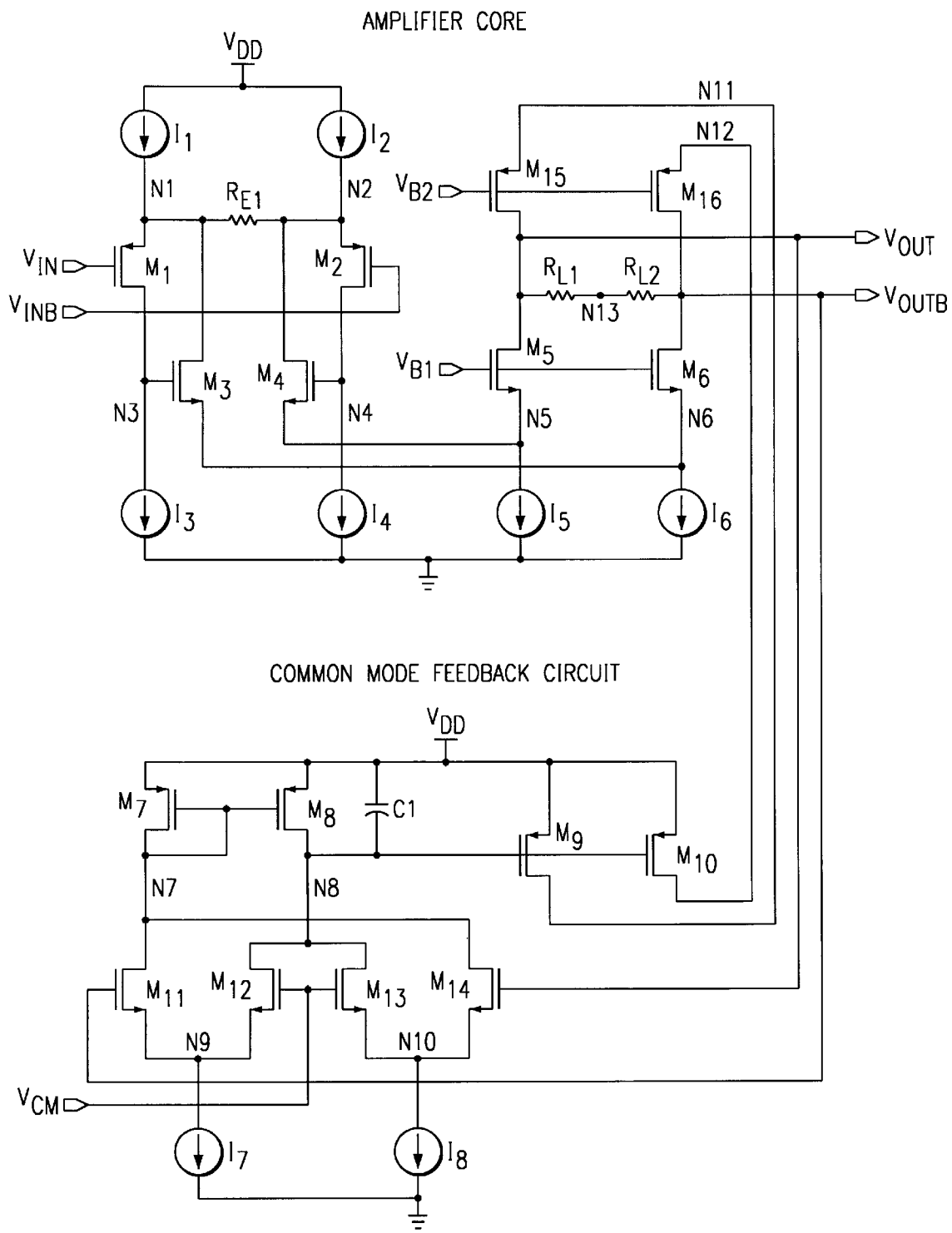
FIG. 4 is a drawing illustrating an alternative embodiment of a fixed gain amplifier.

FIG. 4 presents an alternative embodiment for the output load resistors RL1 and RL2. The super follower transistors M3 and M4 are folded into the output stage as in FIG. 3. A set of cascoded PMOS transistors M15 and M16 connected to M9 and M10 from the common mode feedback circuit are inserted with load resistors RL1 and RL2 connected across them. This allows resistors RL1 and RL2 to have a lower absolute value (note the same applies for RE1 in order to maintain a constant voltage gain) since it has no role in determining the output common mode level and therefore provides even more bandwidth and better linearity than FIG. 3. This way, the common mode may be chosen closer to the mid-supply, which better suits typical applications. Pin VB2 should be set to an appropriate constant bias voltage to keep the cascoded transistors M15 and M16 saturated over all operating conditions. The output load resistors RL1 and RL2 are between Vout and VoutB. This allows the common mode to be lowered over FIG. 3 as FIG. 3 sets the common mode closer to the power supply through load resistors RL1 and RL2. So, automatically, the common mode in FIG. 3 is quite high and close to the supply for the same choice of currents I1–I6 and resistor values RE1, RL1, and RL2. FIG. 4 allows the load resistors RL1 and RL2 to be smaller than RL1 or RL2 of FIG. 3 and therefore, provides more bandwidth and better linearity.

While the invention has been particularly shown and described by the foregoing detailed description, it will be understood by those skilled in the art that various other changes in form and detail may be made without departing from the spirit and scope of the invention as defined by the following claims.

What is claimed is:

1. A CMOS fixed gain amplifier, comprising:
   a CMOS input stage for receiving a differential voltage, the CMOS input stage including;
      a first CMOS input transistor connected in series with a first current source; and
      a second CMOS input transistor connected in series with a second current source;
   a CMOS output stage for transmitting a fixed voltage, the CMOS output stage including:
      a first leg having a first CMOS output transistor and a third current source connected in series; and
      a second leg having a second CMOS output transistor and a fourth current source connected in series; and
   CMOS super follower transistors for coupling the input stage to the output stage so that all of a differential current flows through the super follower transistors and into the output stage.

2. A CMOS fixed gain amplifier, comprising:
   a CMOS input stage for receiving a differential voltage, the CMOS input stage including;
      a first CMOS input transistor connected in series with a first current source;
      a second CMOS input transistor connected in series with a second current source; and
      a degeneration resistor connected between the first CMOS transistor and the second CMOS transistor;
   a CMOS output stage for transmitting a fixed voltage, the CMOS output stage including:

a first leg having a first load resistor, a first CMOS output transistor and a third current source connected in series; and a second leg having a second load resistor, a second CMOS output transistor and a fourth current source connected in series; and CMOS super follower transistors for coupling the input stage to the output stage so that all of a differential current flows through the super follower transistors and into the output stage.

3. The CMOS fixed gain amplifier of claim 2 wherein the super follower transistors comprise:

A third CMOS transistor having its drain connected to the degeneration resistor, its source connected between the series connection of the first output transistor and the third current source of the first leg of the output stage and having its gate connected to the drain of the first CMOS input transistor; and A fourth CMOS transistor having its drain connected to the degeneration resistor, its source connected between the series connection of the second output transistor and the fourth current source of the second leg of the output stage and having its gate connected to the drain of the second CMOS input transistor.

4. The CMOS fixed gain amplifier of claim 3 further comprising:

A fifth current source connected to the gate of the first super follower transistor and to the drain of the first CMOS input transistor; and A sixth current source connected to the gate of the second super follower transistor and to the drain of the second CMOS input transistor.

5. The CMOS fixed gain amplifier of claim 4 further comprising:

A common mode feedback circuit connected to the first leg of the output stage and connected to the second leg of the output stage.

6. The CMOS fixed gain amplifier of claim 6 wherein the common mode feedback circuit has a first connection connected to the first load resistor and a second connection connected to the first super follower transistor; and The common mode feedback circuit has a third connection connected to the second load resistor and a fourth connection connected to the second super follower transistor.

* * * * *